United States Patent [19]

Akram

[11] Patent Number: 5,990,694
[45] Date of Patent: Nov. 23, 1999

[54] INTEGRATED CIRCUIT PROBING METHOD

[75] Inventor: Salman Akram, Boise, Id.

[73] Assignee: Micron Technology, Inc., Boise, Id.

[21] Appl. No.: 08/965,163

[22] Filed: Nov. 6, 1997

[51] Int. Cl.$^6$ .................................................. G01R 1/073
[52] U.S. Cl. ...................................... 324/757; 324/158.1
[58] Field of Search .................................... 324/757, 754, 324/158.1; 134/1.3, 26, 61, 94.1, 95.1

[56] References Cited

U.S. PATENT DOCUMENTS

| | | | |
|---|---|---|---|
| 3,628,144 | 12/1971 | Aronstein | 324/754 |
| 4,590,422 | 5/1986 | Milligan | 324/754 |
| 5,220,279 | 6/1993 | Nagasawa | 324/754 |
| 5,326,428 | 7/1994 | Farnworth et al. | 156/654 |
| 5,478,779 | 12/1995 | Akram | 437/189 |
| 5,652,428 | 7/1997 | Nishioka et al. | 250/307 |
| 5,666,063 | 9/1997 | Abercrombie et al. | 324/754 |

*Primary Examiner*—Ernest Karlsen
*Attorney, Agent, or Firm*—Wells, St. John, Roberts, Gregory & Matkin, P.S.

[57] ABSTRACT

A circuit probing method includes contacting a conductive probe with a contact pad of an electronic circuit. An electric signal is sent between the contacted probe and the contact pad. After sending the signal, the conductive probe and contact pad are removed from contacting one another. After the removing, the conductive probe is chemically cleaned. In a further aspect, an integrated circuit on a semiconductor substrate has at least one conductive contact pad. A circuit probe formed from a semiconductor wafer has at least one conductive projecting apex. The conductive apex is brought into contact with the contact pad. An electric signal is sent between the contacted contact pad and the projecting apex. After sending the signal, the apex and contact pad are removed from contacting one another. After the removing, the conductive apex of the circuit probe is chemically cleaned. After the chemical cleaning, the conductive apex is contacted with another contact pad of another integrated circuit formed on another semiconductor substrate, and an electric signal is sent therebetween.

18 Claims, 4 Drawing Sheets

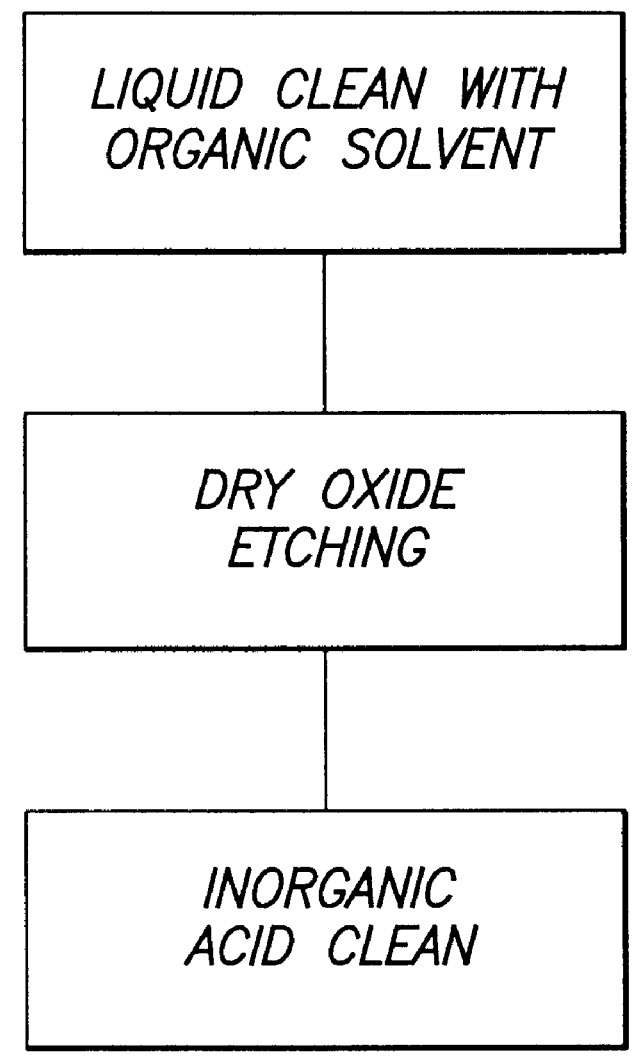

INTEGRATED CIRCUIT PROBING METHOD

TECHNICAL FIELD

This invention relates to integrated circuit and other circuit probing methods.

BACKGROUND OF THE INVENTION

Circuit probing devices in the electronic industry typically utilize sharp pins or needles which are used to physically and removably contact circuit bonding pads. For example, circuit probe devices are utilized during manufacture for testing operability of circuits formed on monolithic semiconductor substrates. Circuit probe devices are also utilized to program integrated circuits, such as ROM devices.

Conventional probe pins typically are aligned to engage the bond pads of the circuitry being tested, programmed or otherwise accessed at an angle other than perpendicular. This enables the pins to bend somewhat when contacting the bond pads such that better and more reliable physical contact is made. Some scraping or removal of the bond pad material (typically aluminum), however, can occur. The removed material can adhere to the probe pins when the probe device is removed from the integrated circuit. The removed bonding pad and other material on the pins is presently subsequently removed from the pins by mechanical scraping with an abrasive surface, such as a sandpaper-like product.

A significant improvement in circuit probing and apparatus used therein has been developed by the assignee of this patent. Exemplary preferred methods and apparatus pertaining thereto are disclosed in U.S. Pat. Nos. 5,326,428 and 5,478,779, which are herein incorporated by reference. In preferred embodiments, such disclose probe cards formed of a semiconductor substrate, such as a monocrystalline silicon wafer. The cards are fabricated by etching into the silicon wafer to create peaks which project from the wafer. Projecting apexes are also fabricated to project from the peaks. An insulative material, such as silicon dioxide, is formed over the apexes and peaks. A conductive material, such as metal, is formed over the apexes, and is patterned to extend to desired locations and circuitry to enable functioning as a conductive probe card.

These sharp conductive peaks are utilized to engage bond pads of integrated circuitry formed on monolithic chips, and other circuitry. The apexes can operate by actually physically deforming the bond pad slightly, and projecting thereinto preferably substantially perpendicularly relative to the typical planar orientation of the bond pads. This engagement can result in more reliable electrical interconnection, but unfortunately can also result in more aluminum or other metal material from the bond pads adhering to the apexes upon removal. The outermost contacting metal of such silicon probe cards is typically and preferably made of some material other than aluminum, such as W, $TiSi_2$, or $WSi_x$. In addition to metal being removed from the bond pads, such engagement also can result in removal of organic material and oxide material present on the circuit bond pads.

Mechanical removal of such contaminants removes the contaminants only from the outermost surfaces being scraped, and can leave undesired material on other locations of the probe card. This can have a tendency to reduce the life of the probe cards to a shorter period than desired. Furthermore, mechanical removal tends to cause damage to brittle metal coated on the probe tips or projecting apexes.

SUMMARY OF THE INVENTION

In accordance with one aspect of the invention, a circuit probing method includes contacting a conductive probe with a contact pad of an electronic circuit. An electric signal is sent between the contacted probe and the contact pad. After sending the signal, the conductive probe and contact pad are removed from contacting one another. After the removing, the conductive probe is chemically cleaned.

In further aspects of the invention, an integrated circuit on a semiconductor substrate has at least one conductive contact pad. A circuit probe formed from a semiconductor wafer has at least one conductive projecting apex. The conductive apex is brought into contact with the contact pad. An electric signal is sent between the contacted contact pad and the projecting apex. After sending the signal, the apex and contact pad are removed from contacting one another. After the removing, the conductive apex of the circuit probe is chemically cleaned. After the chemical cleaning, the conductive apex is contacted with another contact pad of another integrated circuit formed on another semiconductor substrate, and an electric signal is sent therebetween. The process can be repeated several times. Further, multiple probe engagements can of course occur between cleanings.

BRIEF DESCRIPTION OF THE DRAWINGS

Preferred embodiments of the invention are described below with reference to the following accompanying drawings.

FIG. 4 is a block diagram of a preferred chemical cleaning sequence in accordance with an aspect of the invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
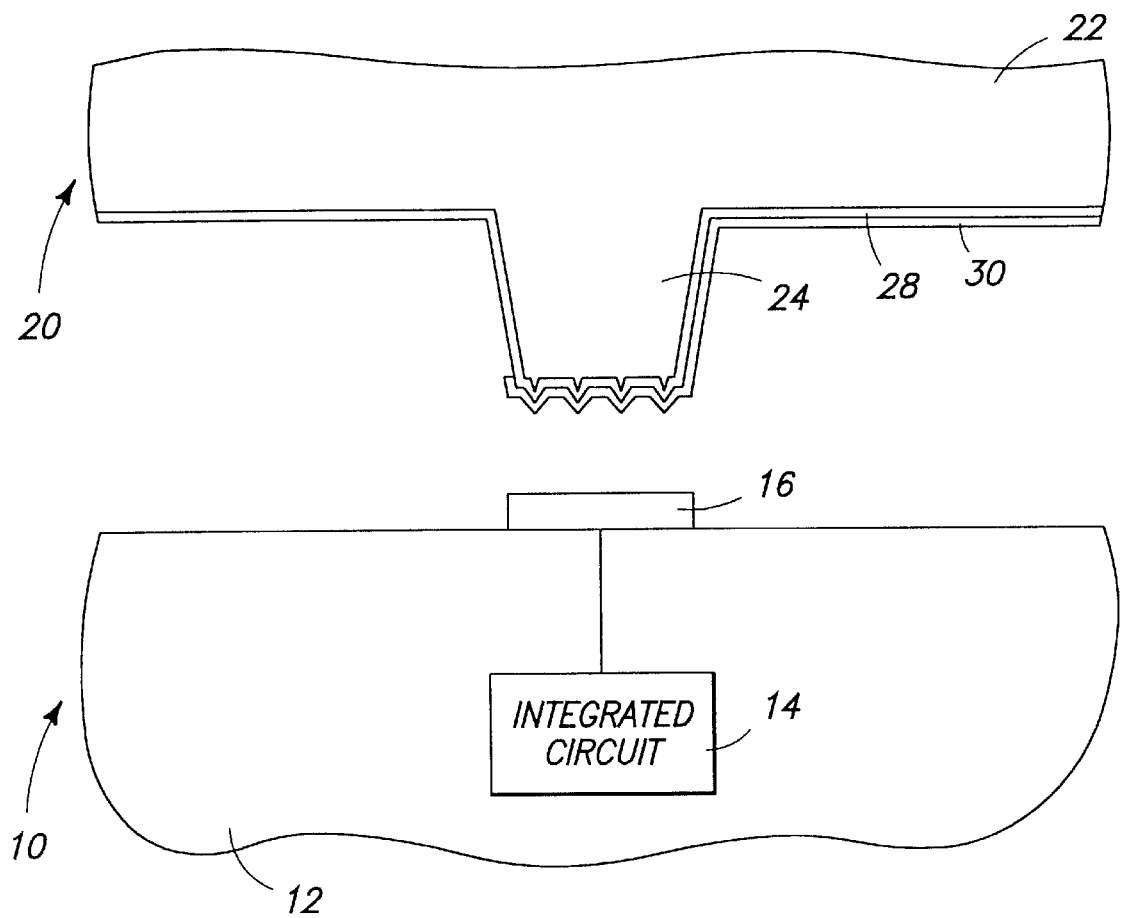
FIG. 1 is a diagrammatic sectional view of an integrated circuit probing method in accordance with the invention.

Referring to FIG. 1, a substrate is indicated generally with reference numeral 10. Such preferably comprises a bulk semiconductor substrate 12, preferably in the form of a monolithic chip or wafer predominately comprising monocrystalline silicon and other insulative and conductive layers. Integrated circuitry illustrated schematically at 14 is formed relative to substrate 12 and electrically connects with a number of conductive metal contact or bond pads, with one such contact or bond pad 16 being illustrated.

A circuit probe device 20 is provided, preferably in the form of preferred or other embodiments encompassed by the disclosures of U.S. Pat. Nos. 5,326,428 and 5,478,779. Such comprises a semiconductor substrate 22, preferably of monocrystalline silicon. A projection 24 extends from silicon substrate 22. Projection 24 has an outermost surface having a series of apexes 26 projecting therefrom. A layer 28 of insulative material, such as silicon dioxide, is formed over silicon substrate 22 and correspondingly projection 24 and apexes 26. A conductive metal layer 30, such as W or $WSi_x$, is formed over insulating layer 28 over projection 24 and apexes 26, and is patterned to extend to circuitry or connection nodes on circuit probe 20 not specifically depicted. Thus, exemplary conductive apexes are provided.

Figure 2:
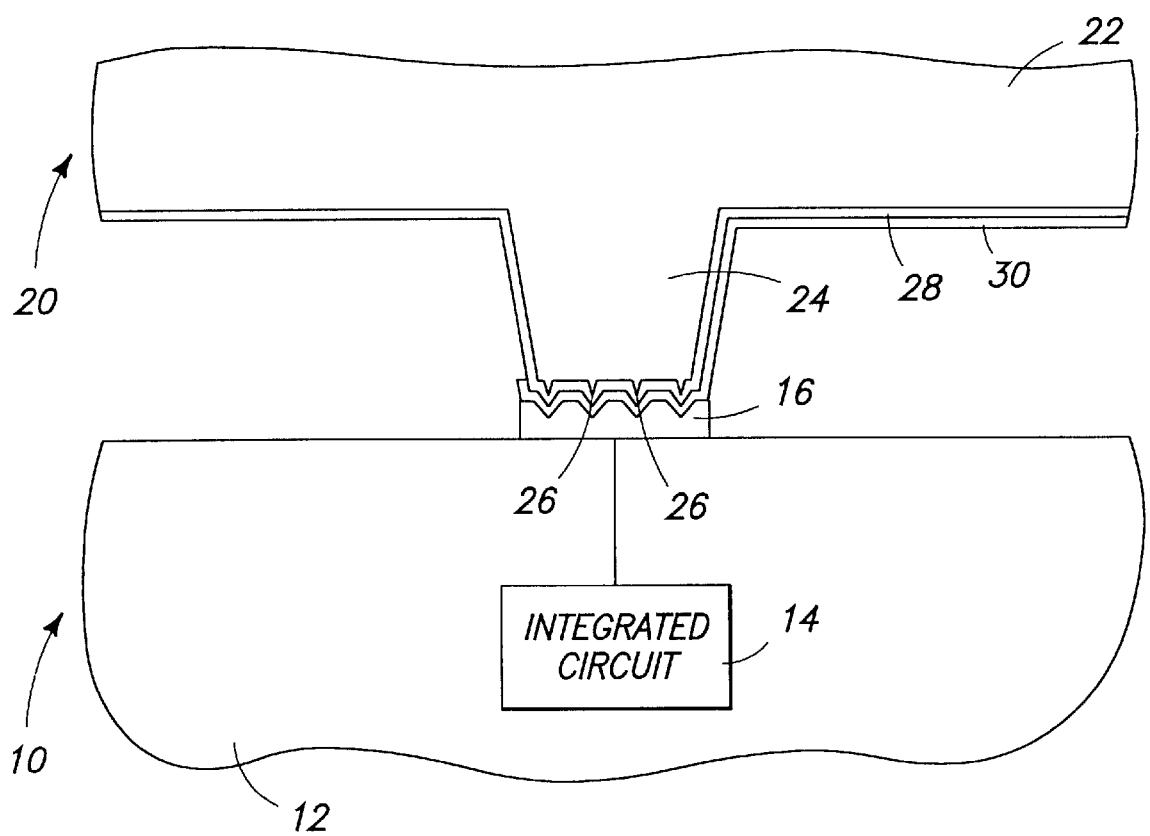
FIG. 2 is a view of the FIG. 1 components at a processing step subsequent to that depicted by FIG. 1.

Referring to FIG. 2, bond pads 16 and projection 24 are brought into engaging relation such that metal layer 30 of projecting apexes 26 contacts bond pad 16 for electrical engagement. In accordance with whatever probing function is to be accomplished, an electric signal is sent between contacted metal contact pad 16 and outer conductive metal layer 30 of projection 24.

Figure 3:
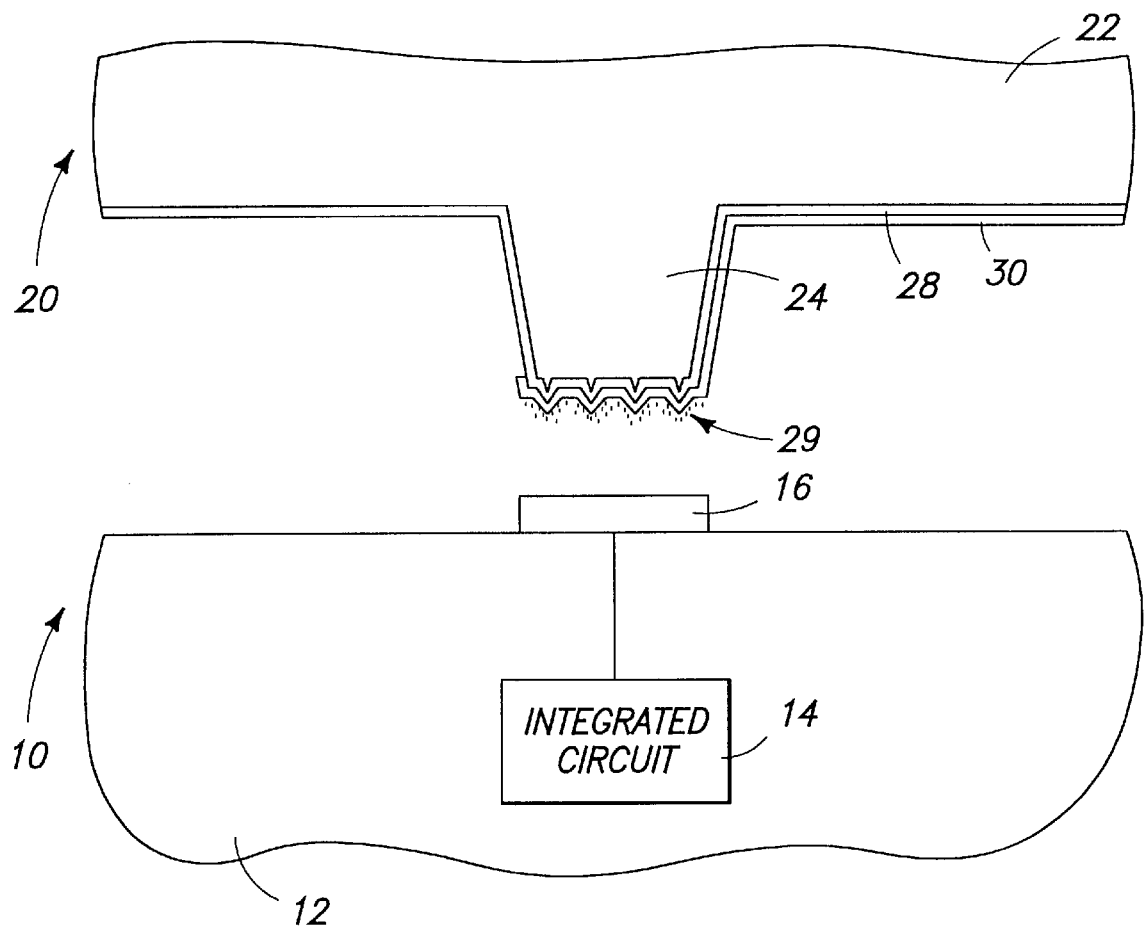
FIG. 3 is a view of the FIG. 1 components at a processing step subsequent to that depicted by FIG. 2.

Referring to FIG. 3, projection 24 with its associated apexes and contact pad 16 are removed from contacting one another after sending the electric signal. Material from bond pad 16 adhering to the conductive apexes is indicated at 29. Then after such removal, the conductive apexes with layer 30 thereover are chemically cleaned. Preferably, such chemical cleaning comprises at least two discrete chemical cleaning steps, and more preferably at least three discrete chemical cleaning steps. Such cleaning preferably includes one or more wet chemical process cleanings and/or one or more dry chemical process cleanings.

An exemplary and preferred cleaning sequence is diagrammatically shown in FIG. 4. The preferred sequence includes an initial liquid cleaning with an organic solvent to remove any organics extracted from bond pad 16. A preferred technique is to use a solution of 100% n-methyl-2-pyrolidine at room temperature and pressure.

Subsequently, a dry etching of the outer metal layer is conducted, for example, utilizing a dry oxide etch to remove any oxide or other contaminates from the outer surface of the probe. Example active ingredients for such etching include $Cl_2$ and $BCl_3$. Other chemistries based on $SiCl_4$, $CHCl_3$, $CF_4$, $CHF_3$ and $CCl_4$ can be utilized. One specific example oxide etch for a single wafer processor (with or without plasma) is 50 sccm $CF_4$, 25 sccm $CHF_3$, and 100 sccm He at a pressure of 20 mTorr, with the wafer susceptor being held at a temperature of 55° C. Such may also serve to remove a portion of the preferred W or $WSi_x$ of layer 30. Alternately, a dry metal etch can be utilized. For example, one example aluminum plasma etch in a single wafer processor includes power at 225W–750W, susceptor temperature of 55° C., pressure at 12 mTorr, $Cl_2$ at 85 sccm, $BCl_3$ at 40 sccm, $CF_4$ at 10 sccm and $N_2$ at 8 sccm.

Subsequently, probe 20 is subjected to an inorganic acid solution, such as a dilute HF solution of 100:1 by volume $H_2O$:HF by dipping or spraying. Such is utilized to remove any remaining material from the apexes. Further, such final etch chemistry or cleaning time can be selected, if desired, to etch a portion (i.e., preferably less than 2%) of metal layer 30, thereby assuring or providing a greater degree of contaminant removal and leaving a clean, exposed outer surface for subsequent engagement of a bond pad with circuit probe 20.

The invention contemplates using any one, two and/or other chemical cleaning steps in any sequence. By way of example only, an alternate cleaning process, particularly where the removed contaminant comprises aluminum, could utilize an etch chemistry utilizing an aluminum etchant. An example wet etch would include a solution of phosphoric acid, nitric acid, water and acetic acid in respective volumetric ratios of 16:1:1:2. Typically, etch rates of 1 micron per minute can be achieved at 45° C. using such a wet etch chemistry. Such a wet etch by itself is preferred where Al is substantially the only material transferred by the projecting apex.

Other preferred chemistries would include anything which preferably would selectively etch the metal material removed from the bond pad relative to the metal material of the projecting apexes where such constitute different materials. The FIG. 4 depicted sequence and chemistry is preferred in the context of aluminum bond pad engagement where the projecting tips comprise W, $TiSi_2$, or $WSi_x$ and the chemistry is chosen to achieve the greatest degree of cleaning with minimal, if any, etch of the W, $TiSi_2$, or $WSi_x$.

After conducting the chemical cleaning, the conductive apexes are contacted with another contact pad of another integrated circuit formed on another semiconductor substrate, and an electric signal is sent therebetween. The process continues until such time as the life of the probe card is exhausted, with the intervening cleanings intending to extend the life of the probe card. Cleanings could, of course, occur intermediate each circuit probing, or at intervals of several circuit probing steps.

The above invention is believed to have its greatest applicability in cleaning the probe cards as described and designed for probing integrated circuitry formed on monolithic substrates. The invention is also expected, however, to have applicability to cleaning other integrated circuit probing devices, such as the prior art and other circuitry probing devices having deflectable pins or needles for engaging bond or contact pads of integrated circuitry formed on monolithic substrates. Further, multiple probe cards can be formed on a semiconductor wafer and the cleaning is also then preferably extended to simultaneously clean all probe cards.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. An integrated circuit probing method comprising:

providing an integrated circuit on a semiconductor substrate, the integrated circuit having at least one conductive contact pad;

providing a circuit probe formed from a semiconductor wafer, the circuit probe comprising at least one conductive projecting apex;

contacting the conductive apex with the contact pad;

sending an electric signal between the contacted contact pad and the projecting apex;

after sending the signal, removing the apex and contact pad from contacting one another;

after the removing, chemically cleaning the conductive apex of the circuit probe, the chemically cleaning comprising at least two discrete chemical cleaning steps;

after the chemical cleaning, contacting the conductive apex with another contact pad of another integrated circuit formed on another semiconductor substrate, and sending an electric signal therebetween.

2. The integrated circuit probing method of claim 1 wherein the chemical cleaning comprises at least three discrete chemical cleaning steps.

3. The integrated circuit probing method of claim 1 wherein the chemical cleaning comprises wet chemical process cleaning.

4. The integrated circuit probing method of claim 1 comprising contacting the conductive apex with a contact pad of at least one other integrated circuit and sending an electric signal between the contacted contact pad of the one other circuit and the projecting apex before the chemical cleaning.

5. The integrated circuit probing method of claim 1 wherein the chemical cleaning comprises cleaning in an acid solution.

6. The integrated circuit probing method of claim 1 wherein the chemical cleaning comprises dry chemical process cleaning.

7. The integrated circuit probing method of claim 1 wherein the chemical cleaning comprises dry oxide etching.

8. The integrated circuit probing method of claim 1 wherein the chemical cleaning comprises cleaning with an organic solvent.

9. The integrated circuit probing method of claim 1 wherein the chemical cleaning comprises both wet chemical process cleaning and dry chemical process cleaning.

10. The integrated circuit probing method of claim 9 wherein the wet chemical process cleaning is conducted before the dry chemical process cleaning.

11. The integrated circuit probing method of claim 9 wherein the wet chemical process cleaning is conducted after the dry chemical process cleaning.

12. The integrated circuit probing method of claim 1 wherein the cleaning comprises dipping the circuit probe into a chemical cleaning solution.

13. The integrated circuit probing method of claim 1 wherein the conductive contact pad comprises aluminum, the chemical cleaning comprises cleaning the projecting apex with an aluminum etchant.

14. The integrated circuit probing method of claim 1 wherein the conductive contact pad and conductive projecting apex comprise different conductive materials, the chemical cleaning comprising exposing the conductive projecting apex to an etch chemistry which is substantially selective to etch the conductive contact pad material relative to the conductive material of the projecting apex.

15. An integrated circuit probing method comprising:

providing an integrated circuit on a semiconductor substrate, the integrated circuit having at least one conductive metal contact pad;

providing a circuit probe formed from a silicon semiconductor substrate, the circuit probe comprising at least one projection projecting from the silicon substrate and at least one apex projecting from the silicon projection, the apex having an outer conductive metal layer formed thereover;

contacting the metal layer of the projecting apex with the metal contact pad;

sending an electric signal between the contacted metal contact pad and the outer conductive metal layer;

after sending the signal, removing the apex and contact pad from contacting one another;

after the removing, wet chemical processing the outer metal layer of the apex with an organic solvent;

after the removing, dry etching the outer metal layer of the apex;

after the removing, exposing the outer metal layer of the apex to an inorganic acid solution and etching only a portion of said outer metal layer with said acid solution; and after the exposing to the inorganic acid solution, contacting the metal layer of the projecting apex with another metal contact pad of another integrated circuit formed on another semiconductor substrate, and sending another electric signal therebetween.

16. The integrated circuit probing method of claim 15 wherein the exposing to an inorganic acid solution is conducted last among the wet chemical processing, the dry etching and the inorganic acid exposing.

17. The integrated circuit probing method of claim 15 wherein the wet chemical processing is conducted before the dry etching.

18. The integrated circuit probing method of claim 15 wherein the wet chemical processing is conducted before the dry etching, and said exposing to an inorganic acid solution occurs after the dry etching.

* * * * *